United States Patent
Nagao et al.

(10) Patent No.: US 7,382,651 B2
(45) Date of Patent: Jun. 3, 2008

(54) NONVOLATILE SEMICONDUCTOR MEMORY DEVICE

(75) Inventors: Osamu Nagao, Yokkaichi (JP);
Yasuyuki Fukuda, Kamakura (JP);
Hideo Mukai, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/616,122

(22) Filed: Dec. 26, 2006

(65) Prior Publication Data
US 2007/0147117 A1    Jun. 28, 2007

(30) Foreign Application Priority Data
Dec. 27, 2005    (JP)    ............... 2005-376718

(51) Int. Cl.
*G11C 16/00*    (2006.01)
(52) U.S. Cl. .............. 365/185.11; 365/185.23; 365/185.25
(58) Field of Classification Search ............ 365/185.02
See application file for complete search history.

(56) References Cited

U.S. PATENT DOCUMENTS

| | | | |
|---|---|---|---|
| 5,659,505 A | 8/1997 | Kobayashi et al. | |
| 5,777,924 A * | 7/1998 | Lee et al. ............... | 365/185.11 |
| 5,982,670 A | 11/1999 | Yamashita | |
| 6,721,208 B2 | 4/2004 | Jung et al. | |
| 7,184,314 B2 * | 2/2007 | Hosono et al. ......... | 365/185.25 |
| 2002/0057599 A1 | 5/2002 | Miyawaki et al. | |
| 2003/0223273 A1 | 12/2003 | Ohtani | |
| 2004/0027886 A1 | 2/2004 | Tomita et al. | |
| 2005/0141284 A1 | 6/2005 | Futatsuyama | |

FOREIGN PATENT DOCUMENTS

| | | |
|---|---|---|
| JP | 11-306769 | 11/1999 |
| JP | 2000-90679 | 3/2000 |
| JP | 2001-358238 | 12/2001 |
| JP | 2002-133877 | 5/2002 |
| JP | 2002-157890 | 5/2002 |
| JP | 2003-178590 | 6/2003 |
| JP | 2004-6549 | 1/2004 |
| JP | 2004-71092 | 3/2004 |
| JP | 2005-191413 | 7/2005 |

\* cited by examiner

*Primary Examiner*—Tan T. Nguyen
(74) *Attorney, Agent, or Firm*—Oblon, Spivak, McClelland, Maier & Neustadt, P.C.

(57) ABSTRACT

In a control order of non-selected blocks at the time of data erase operation of one or a plurality of blocks, the control gate line is controlled to ground potential at first, then subsequently, a transfer transistor of the non-selected blocks is set to be an off-state. Next, high voltage is supplied to the well region and the data of the selected block is erased. Then, the control gate line is charged to the voltage which is used, for instance, at the time of reading out, or to the voltage (Vcg) which is used at the verification (Vcg). After the control gate line is charged to Vcg, the erase voltage supplied to the well region is discharged. Then, the control gate line is returned to ground potential after completing the discharge of the well region, and thus the data erase operation of the block is completed.

20 Claims, 12 Drawing Sheets

NONVOLATILE SEMICONDUCTOR MEMORY DEVICE

CROSS REFERENCE TO RELATED APPLICATION

This application is based upon and claims the benefit of priority from the prior Japanese Patent Application No. 2005-376718, filed on Dec. 27, 2005, the entire contents of which is incorporated herein by reference.

BACKGROUND OF THE INVENTION

1. Field of the Invention

The present invention relates to an electrically programmable and electrically erasable nonvolatile semiconductor memory.

2. Description of the Related Art

Conventionally, EEPROM, by which data is electrically rewritable, is known as one of semiconductor memories. Above all, a NAND type EEPROM (a NAND type flash memory device), which has NAND type cells configured of a plurality of memory cells and which is a unit storing 1 bit being connecting in series, has received much attention. The NAND type flash memory device, for instance, is utilized as a memory card for storing image data of digital still cameras.

In recent years, progress has been made with larger capacity NAND type flash memory devices, and the programming unit (page capacity) and erase unit (block capacity) has also become larger, for example, Published and Unexamined Japanese Patent Application (kokai) No. 2002-133877.

BRIEF SUMMARY OF THE INVENTION

A first aspect of the embodiment of the invention relates to a non-volatile semiconductor memory device comprising: a plurality of memory cells being electrically programmable and electrically erasable, said memory cell having a channel region of p-type well formed on a n-type semiconductor substrate; a plurality of memory blocks having said plurality of memory cells on which are arranged; a selection circuit selecting said block; a plurality of word lines arranged in said block and commonly connected to said memory cells arranged in the same row of said block; a plurality of control gate lines arranged corresponding to each of said word lines and supplying voltages to said corresponding word line; a plurality of transfer transistors selectively connecting said plurality of word lines and said plurality of control gate lines respectively; a controller setting time of charging said control gate lines after an erase operation in more than one said block at the same time; and a voltage generator charging said control gate line within said time of charging set by said controller.

A second aspect of the embodiment of the invention relates to a non-volatile semiconductor memory device comprising: a plurality of memory cells being electrically programmable and electrically erasable, said memory cell having a channel region of p-type well formed on a n-type semiconductor substrate; a plurality of memory blocks having said plurality of memory cells on which are arranged; a selection circuit selecting said block; a plurality of word lines arranged in said block and commonly connected to said memory cells arranged in the same row of said block; a plurality of control gate lines arranged corresponding to each of said word lines and supplying voltages to said corresponding word line; a plurality of transfer transistors selectively connecting said plurality of word lines and said plurality of control gate lines respectively; a controller setting time of charging said control gate lines after an erase operation in more than one said block at the same time; a voltage generator charging said control gate line within said time of charging set by said controller; and a discharge selection section selecting either a first discharge method and a second discharge method, said first discharge method being starting charging said control gate line before discharging an erase voltage supplied to said p-type well after said erase operation and said second discharge method being changing said time of discharging said erase voltage.

DETAILED DESCRIPTION OF THE INVENTION

Embodiments of the present invention will be described below with reference to the drawings. However, the present invention can be implemented in various aspects, and is not interpreted limited to the content of the description of the embodiment showed below.

Figure 1:
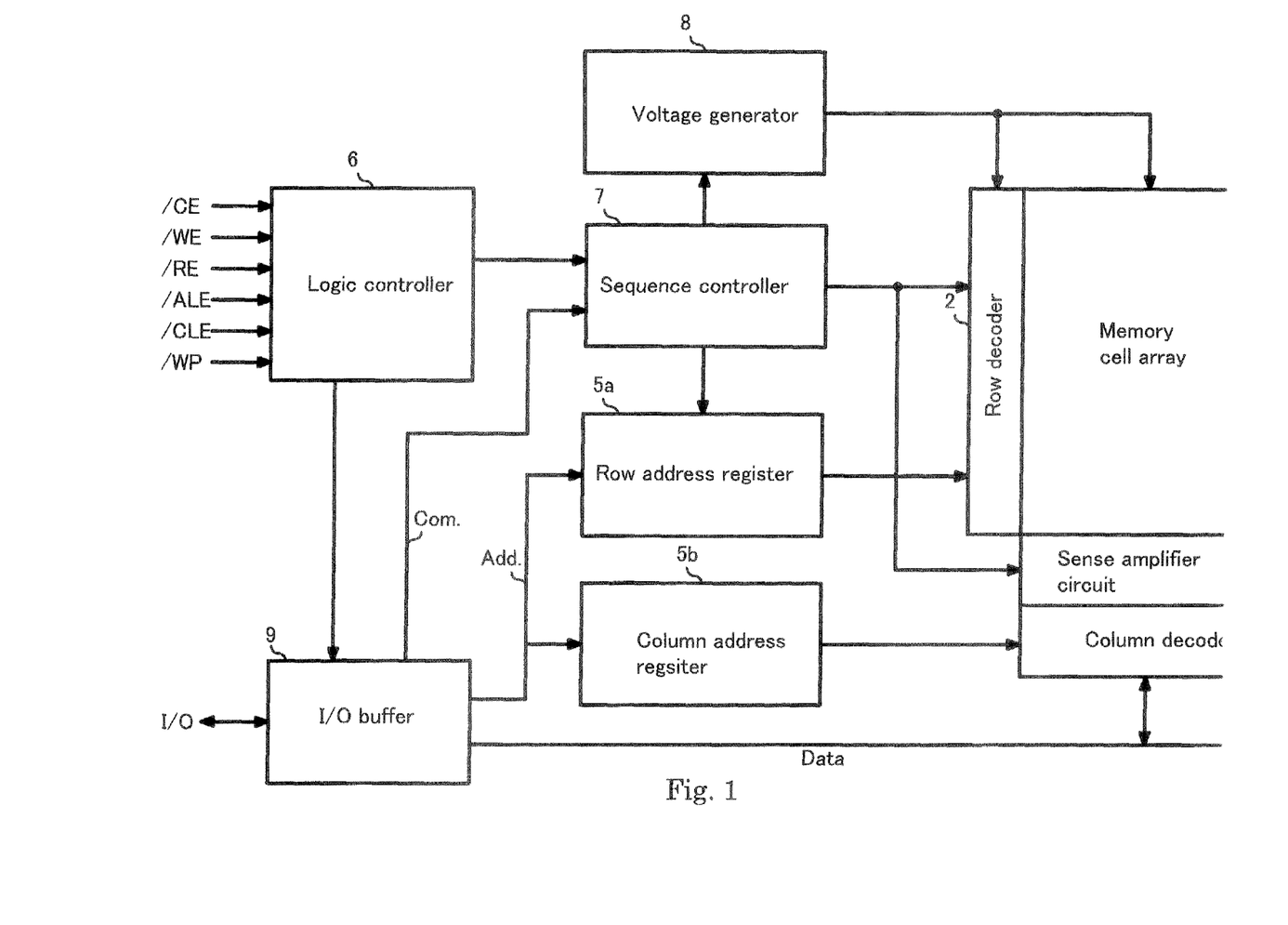
FIG. 1 is a block diagram showing a configuration of the NAND type flash memory device according to one embodiment of the present invention.

FIG. 1 is a functional block diagram of the NAND type flash memory according to an embodiment of the present invention. A memory cell array 1 is configured with an arrangement of the plurality of memory cells in matrix form. A row decoder 2 (including a word line driver) selects blocks of the memory cell array 1 and selectively drives word lines and gate lines of memory cell array 1. A sense amplifier circuit 3 serves as a page buffer with sense amplifiers for one page, which is used sensing for bit line data for one page of the memory cell array 1.

One page read data are column-selected by a column decoder (column gate) 4 and output to external I/O terminals via an I/O buffer 9. To the external I/O terminals, for instance, an error correction circuit is connected (not shown here). Of course, the error correction circuit may be mounted within a chip. Write data supplied from the I/O terminals are selected by the column decoder 4 to be loaded in the sense amplifier circuit 3. Address data Add including row address data and column address data, which are input from the I/O terminals, are input to the row address register 5a and the column address register 5b via the I/O buffer 9.

A logic controller 6 outputs internal timing signals to a sequence controller 7 for read, write and erase operations in response to control signals including write enable signal/ WE, read enable signal/RE, address latch enable signal ALE, command latch enable signal CLE and so on. The sequence controller 7 performs a sequence controlling of data reading, data writing and data erasing operations based on the timing signal input from the logic controller 6. A voltage generation circuit 8 is controlled by the sequence controller 7 to output various types of voltages used for the read operations, write operations and the erase operations. These controllers 6, 7 and high voltage generator circuit 8 make up the control means as claimed. The logic controller 6, the sequence controller 7 and the voltage generation circuit 8 make up the control means of the NAND type flash memory. On a practical memory chip, the memory cell array 1 is made up of a plurality of memory cell array blocks which are physically independent of each other.

Figure 2:
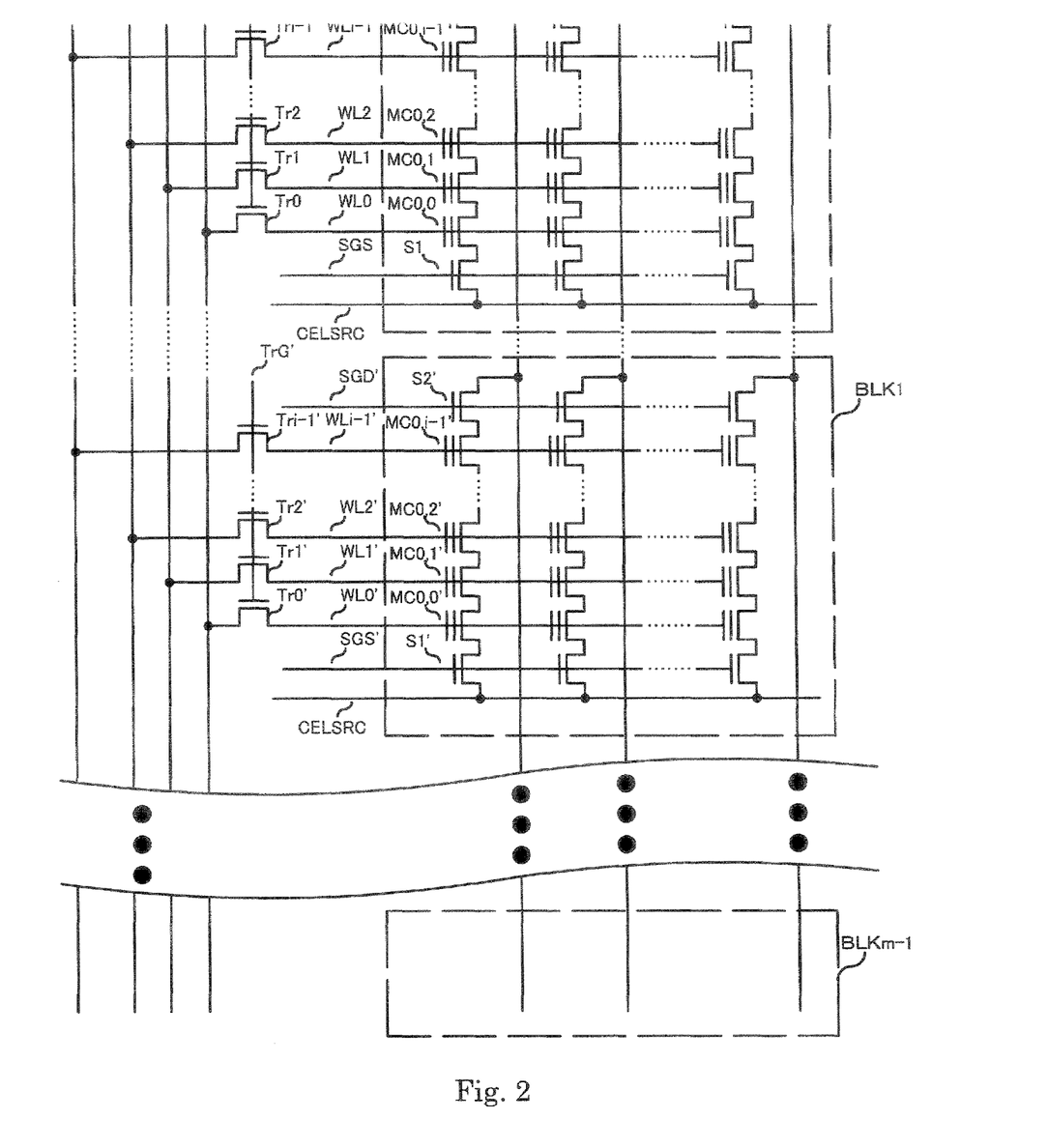
FIG. 2 is a circuit diagram showing a configuration of the memory cell array in the flash memory device according to one embodiment of the present invention.

FIG. 2 is a diagram showing an example with m memory cell array blocks BLKk (k=0 to m−1) laid out therein. On one substrate, a plurality of blocks are deposited and the aggregate of blocks deposited on one substrate is handled as 1 plane. Each memory cell array block BLKk has a plurality of mutually crossing word lines WL0 to WLi−1, and bit lines BL0 to BLj−1. The bit lines BL0 to BLj−1 are provided and railed to extend over all memory cell array blocks BLKk. The memory cells MCp,0 to MCp,i−1 are provided at across points or intersect between the word lines WL0 to WLi−1 and the bit lines BL0 to BLi−1. A plurality of floating gate type memory cells MCp,0 to MCp,i−1, which are provided at across points or intersect between the word lines WL0 to WLi−1 and the bit lines BL0 to BLi−1, are connected in series together to thereby constitute a cell string. A select gate transistor S1 is inserted between the source of a cell on one end side of the cell string and a common source line SCELSRC. A select gate transistor S2 is inserted between the drain of a cell on the opposite end side and the bit line BL. A single cell string and two select transistors that are connected to the opposite ends of the cell string make up a NAND cell unit. A NAND cell unit is made up of 1 cell string and 2 select transistors which are connected to the opposite ends of the cell string.

One of the memory cells MCp,0 to MCp,i−1 has its control gate which is connected to a corresponding one of the word lines WL0 to WLi−1. The select gate transistors S1, S2 have their selected gates which are connected to select gate lines SGS, SGD which are provided in parallel to the word line WL respectively. An ensemble or "cluster" of multiple memory cells MC along a single word line WL becomes a page, which is for use as a unitary portion for data read and write, i.e., a read unit and write unit.

Data writing to a memory cell array is performed per 1 page unit. Data erasing of a memory cell array is performed per block unit.

Data erasing per block unit of a memory cell array is performed by changing the voltage of word lines within a presently selected block (selected block) and a p-type well of substrate. At the time of erasing all data bits within a presently selected block BLKk, give the ground potential to the control gates CG0 to CGi−1, and the transfer transistors Tr0 to Tri−1 become on and then the word lines WL0 to WLi−1 and the control gates CG0 to CGi−1 are connected. At the same time of setting in an electrically floating state the control gates of all memory cells within non-selected blocks, the transfer transistors Tr0 to Tri−1 become off and then the word lines WO0 to WLi−1 and the control gate lines CG0 to CGi−1 are not connected, Thus the control gate of memory cells MCp,0 to MCp,i−1 become an electrically floating state. In this state, a high potential erase voltage (for instance, near 20V) is supplied to the p type well of the substrate, and in the selected block, the word line is at ground potential. Because of the potential difference of 20 V between the erase voltage supplied to the p type well and the ground potential of the word lines, the electrons that have been held at the floating gates of certain memory cells MCp,0 to MC,i−1 of the selected block are drawn out into the well. Thus the data erasing per block unit BLKk is performed. On the other hand, all the word lines WL0 to WKi−1 within non-selected blocks are in floating states, and increase in potential up to the erase voltage or a nearby level. Thus data erasing will not be performed.

Figure 3:
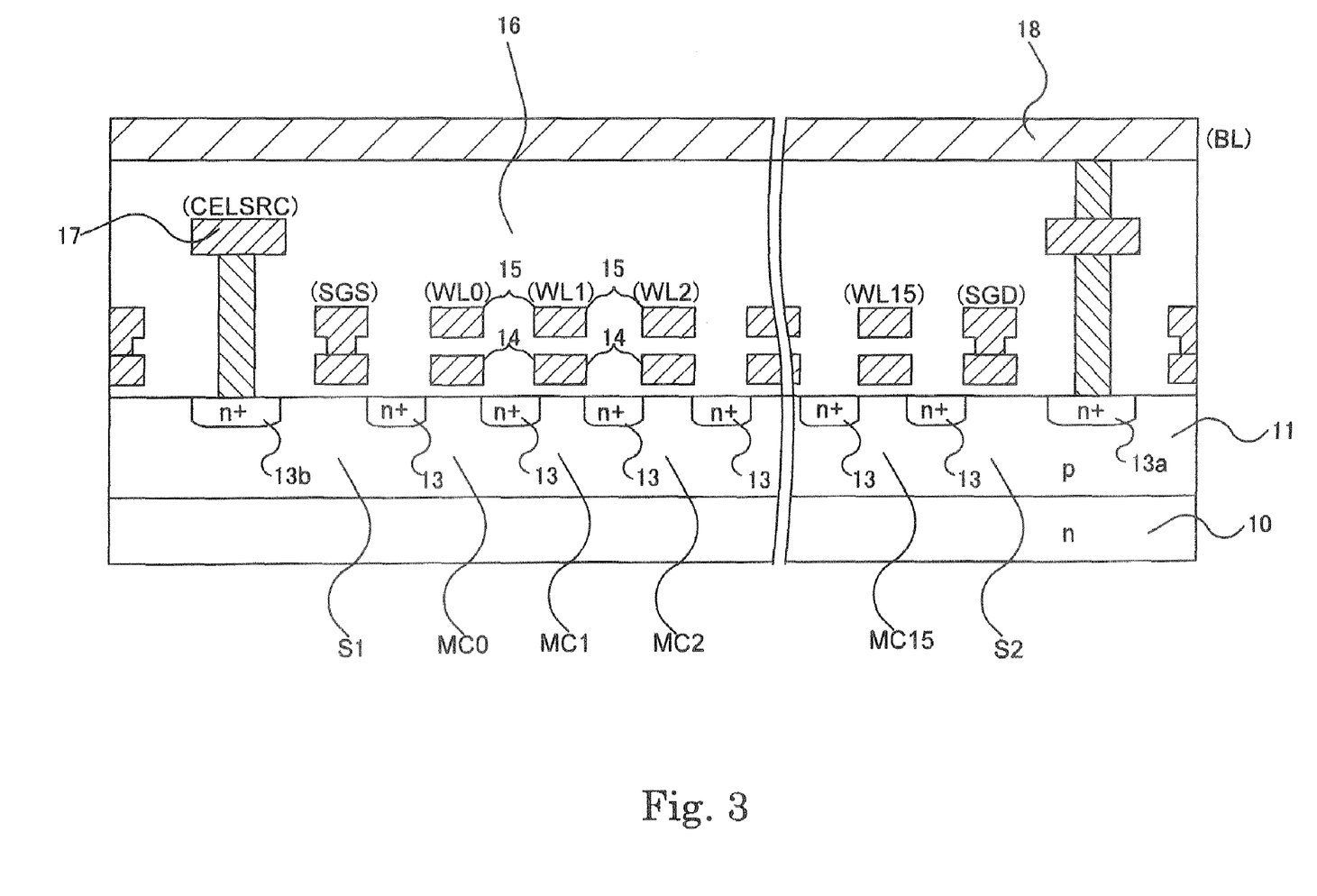
FIG. 3 is a cross sectional view along a bit line of one NAND cell unit in the flash memory device according to one embodiment of the present invention.

FIG. 3 shows a section along a bit line of one NAND cell unit. The memory cells MC0 to MCi−1 are formed on the p-type well which is formed on the n-type semiconductor substrate. The memory cells MC0 to MCi−1 have structures in which the adjacent sources and drains share a n-type diffusion layer 13, and floating gates 14 and control gates 15 are stacked. The control gates 15 are wired in a direction which goes straight toward the back side from the surface of the diagram, and patterning is performed as word lines WL0 to WLi−1, which is common to the plurality of memory cells. The memory cell array 1 is covered with an interlayer insulation film 16. A common source line (CELSRC) 17 inside the block BLKk, which is embedded within an inner section of the interlayer insulation film 16, contacts with a source diffusion layer 13b of the one selection gate transistor S1. The bit line (BL) 18 formed on the interlayer insulation film 16 comes into contact with the drain diffusion layer 13a of the other selection gate transistor. These contacts of the source line 17 and the bit lines 18 are shared in the adjacent NAND cells.

As just described, in the NAND type flash memory, the memory cells being adjacent within the NAND cell unit share the diffusion layer, and the adjacent NAND cell unit shares the wiring contact. Although a detailed description is omitted, the element region and the element division region of striped pattern are arranged alternately in a direction which goes straight toward the back side from the surface of FIG. 3, and the memory cells are configured to each intersecting point of each element region and the word lines WL of the striped pattern perpendicular to this. From the structural characteristics, it is easy for the NAND type flash memory to have density growth and large capacity, so that the effective unit cell area $5F^2$ (F: minimum process size) may be realized.

Figure 4:
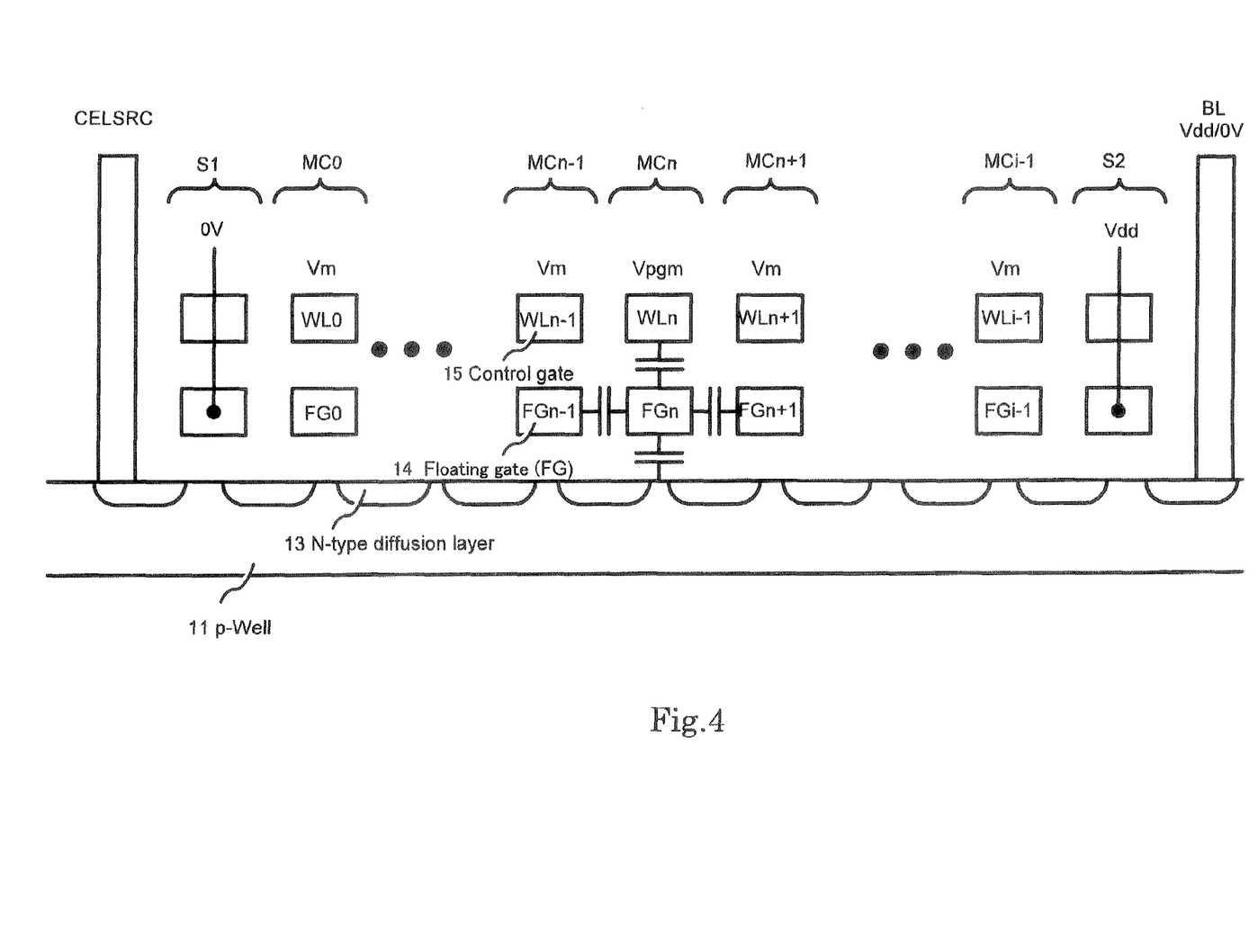
FIG. 4 is a cross sectional view of the memory cell in the flash memory device according to one embodiment of the present invention.

FIG. 4 is a cross sectional view in which an example of configuration of the memory cell section of the NAND type flash memory is given. The basic units of the memory cell section of the NAND type flash memory, for instance, is configured, as shown in FIG. 13, to the plurality of memory cells MC0 to MCi-1 connected in series and two select gate transistor S1 and S2. The select gate transistor S2 is connected to the bit line BL, and the select gate transistor S1 is connected to the bit line BL, and the select gate transistor S1 is connected to the common source line CELSRC within the memory cell array. One memory cell sets the n-type diffusion layer 13 formed on the p-type well 11 as a source/drain, and has the control gate 15 and the floating gate (FG) 14 connected to the word line WL. The method for storing and erasing the data is performed by changing the charge quantity holding in the floating gate (FG) 14 with the write operation and the erase operation. 1 bit of data or more than 1 bit of data are discriminated as a difference of threshold (Vt) distribution of the memory cell by changing the threshold (Vt) distribution of the memory cell.

Referring to FIG. 4 the following describes an example in which voltage is in a state of being supplied during the program operation. During the program operation, the program voltage Vpgm is supplied to the selected word line WLn, and the program pass voltage Vm is supplied to the other word lines WL except for the word line WLn (the non-selected word line WL0 to WLn-1 and WLn+1 to WKi-1). The program voltage Vpgm is a voltage of, for instance, about 20 V; the program pass voltage Vm is a voltage of, for instance, about 10V. The select gate transistor S2 of the bit line BL side has a normal transistor configuration which has no floating gate (FG) 14, and the gate is controlled at a voltage which is slightly lower than the power supply voltage Vdd. The select gate transistor S1 at the source line side also has a configuration with S2, and the gate is controlled at 0V. The bit line BL is controlled at 0V in the case of data program, and is controlled to the power supply voltage Vdd in the case of data program. In the case of data program, 0V that is supplied to the bit line BL is transferred to the front of the select gate transistor S1. Therefore, the channel of selected memory cell MCn becomes 0V, and a current difference of about 20 V occurs between the selected word line WLn and the channel. Then, electrons are injected into the floating gate (FGn) 14 by the Fawler-Nordheim (FN) tunnel current, and the threshold (Vt) distribution shifts in a positive direction. In the case of data non-program, on the other hand, the select gate transistor S2 becomes a cut-off state, thereby the channel becomes a floating state. When the program pass voltage Vm and the program voltage Vpgm are supplied to the word line WL in such a state, the channel potential is boosted. Thus, a state is reached where the FN tunnel current does not flow, and the threshold (Vt) distribution is not shifted and the status quo is held.

Next, a block erase operation of the NAND type flash memory configured as described above will be described?

Figure 5:
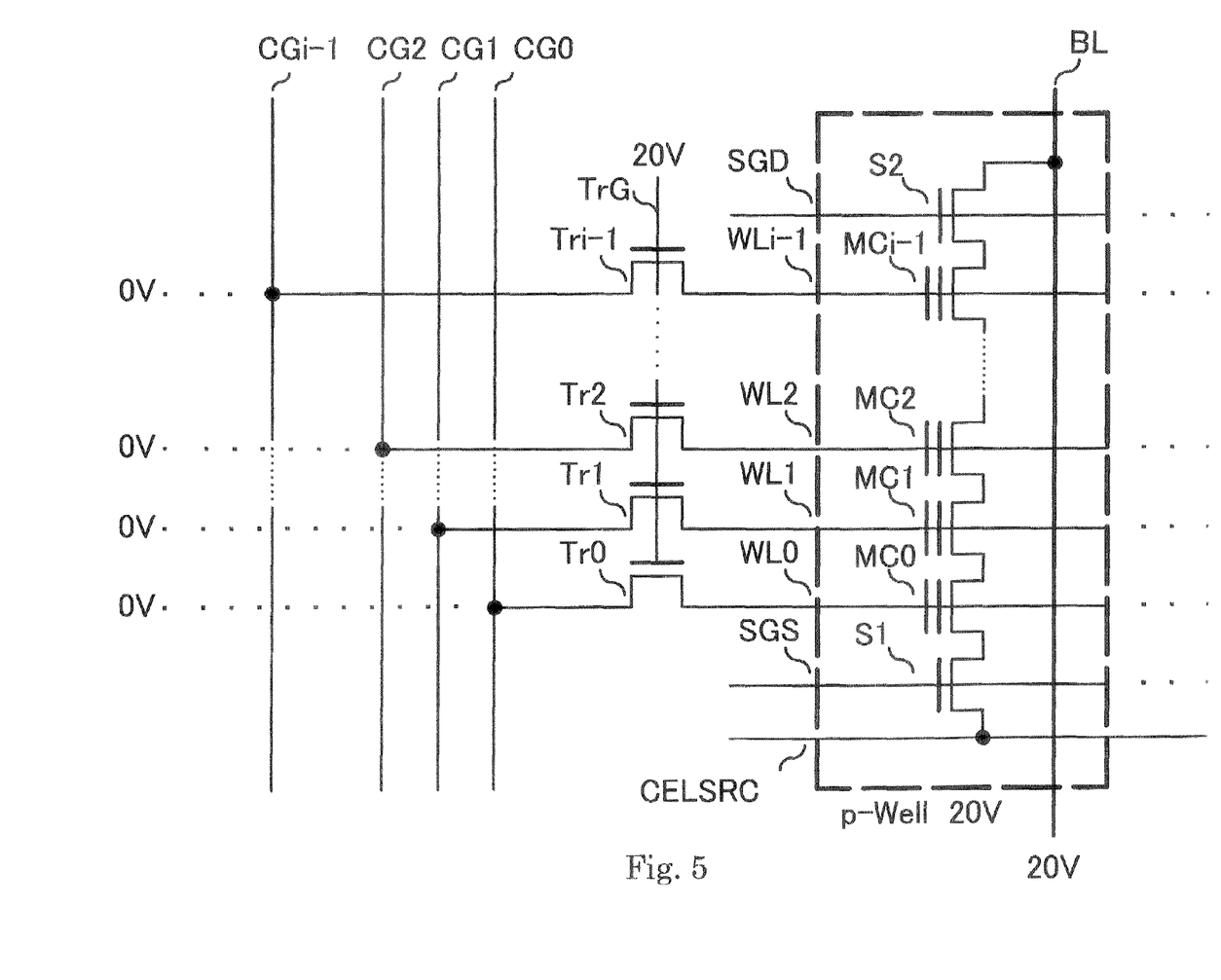
FIG. 5 is a diagram showing a voltage application pattern of the selected block at the time of block erase in the flash memory device according to one embodiment of the present invention.
Figure 6:
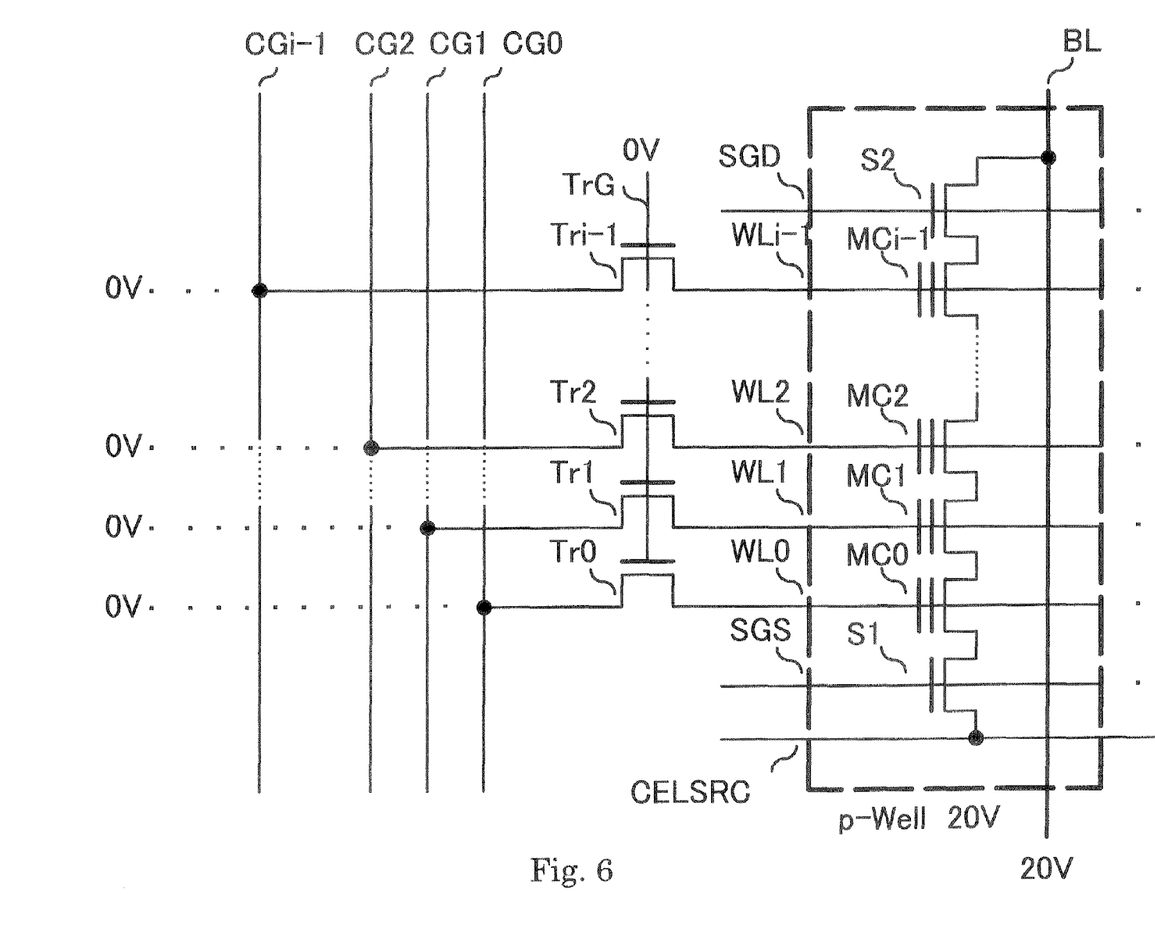
FIG. 6 is a diagram showing a voltage application pattern of the non-selected blocks at the time of block erase in the flash memory device of according to one embodiment of the present invention.

FIG. 5 is a diagram showing a voltage application condition toward the NAND cell unit of the selected block at the time of the block erase operation. FIG. 6 is a diagram showing the voltage application condition toward the NAND cell unit of the non-selected blocks. At the time of data erase of the selected block, the control gate lines CG0 to CGi-1 are controlled to ground potential. Here, a power supply voltage Vdd (for instance, 2.7 V) is supplied to the gate TrG of the transfer transistor which corresponds to the selected block BLk and the gate becomes an on-state. Then, the control gates of the entire memory cells MC0 to MCi-1 in the selected block BLKk (the word lines WL0 to WLi-1) become ground potentials.

At the same time, a ground potential is given to the gate TrG of the transfer transistors Tr0 to Tri-1 of the non-selected block BLKk' and the gate becomes an off-state. Then, the control gate of the entire memory cells MC0 to MCi-1 in the non-selected block BLKk' (the word lines WL0 to WLi-1) becomes a floating state.

The control gate of the entire memory cells MC0 to MCi-1 in the non-selected block BLKk' (the word lines WL0 to WLi-1), and the select gate lines SGS, SGD in the whole blocks become a floating state. In such a state, an erase voltage with high potential (of about 20V), to which the voltage generation circuit 8 shown in FIG. 1 supplies, is supplied to the p-type well region of the memory cells MC0 to MCi-1. In addition, an erase voltage (of about 20 V) is supplied to the bit lines BL0 to BLi-1 and the source line CEKSRC, because these are conducted with the p-type well region. Thereby in the memory cells MC0 to MCi-1 in the selected block BLKk, to the control gate of (the word lines WL0 to WLi-1) which the ground potential is given, electrons in the floating gate (FG) 14 are ejected to the p-type well region, and thus erase per block is performed.

At the same time, the control gate of the entire memory cells MC0 to MCi-1 in the non-selected block BLKk' (the word lines WL0 to WKi-1), and the entire selected gate lines in the whole block BLKk SGS, SGD are in floating states. Therefore, potential boosts up to near the erase potential (about 20V) depending on capacity coupling (for instance, in the case of the selected gate line SGS, depending on coupling capacity of the gate of the selection transistor S1 and the capacity between the ground and the selected gate line SGS)can be gained?. The voltage of the bit lines Bl0 to BLi-1 and the source line CELSRC are the erase voltages (of about 20 V).

When data erase is completed, the erase voltage (of about 20V), which is supplied to the p-type well region of the memory cell array1 from the voltage generation circuit 8 shown in FIG. 1, is discharged. The discharge of the erase voltage is discharged to the ground (GND) when either of the switching transistor TR33, TR34 becomes an on-state, similar to the discharge circuit 102 shown in FIG. 9. The discharge circuit is included in the voltage generation circuit 8 shown in FIG. 1.

Figure 7:
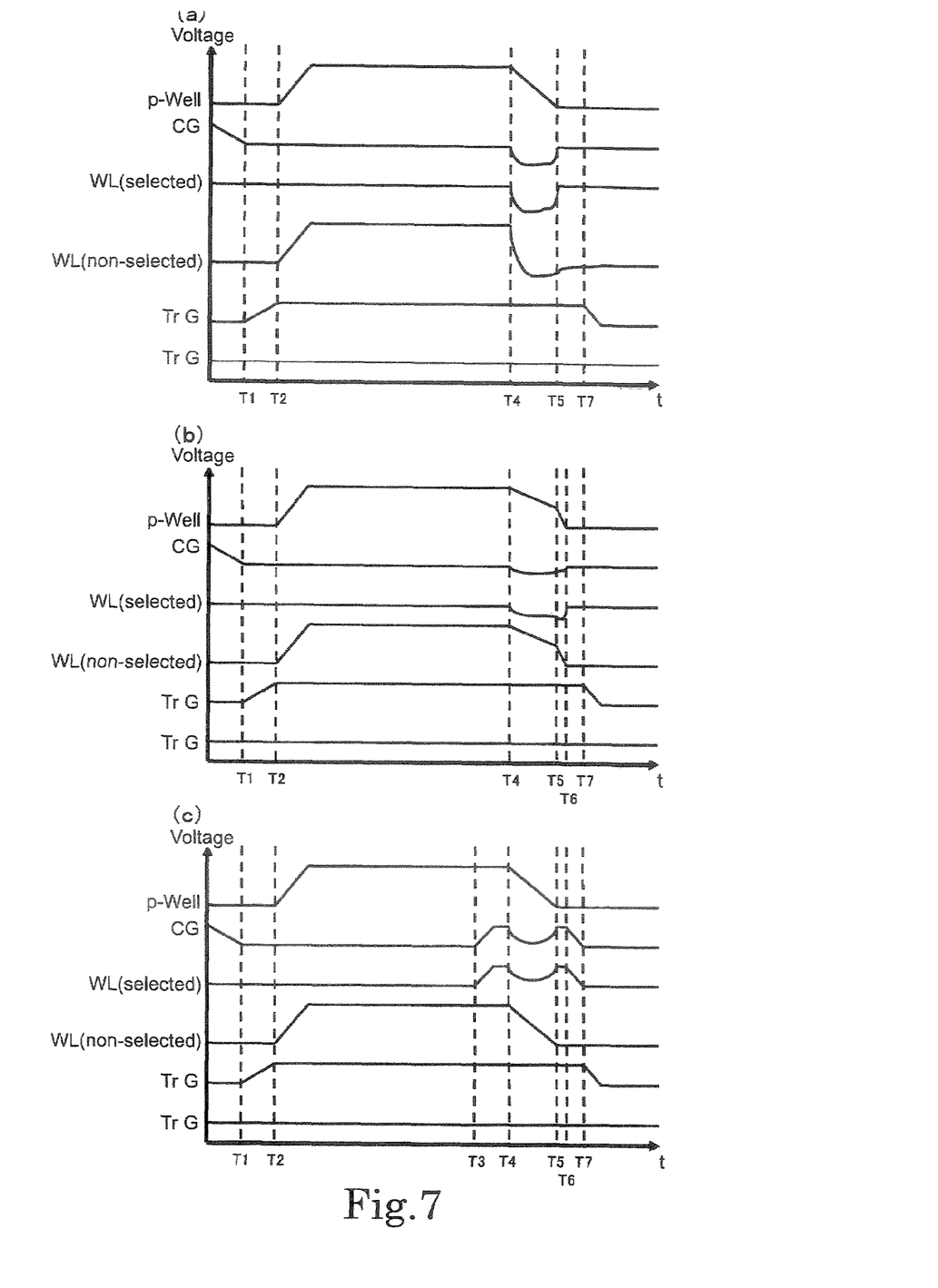
FIG. 7a is a timing chart of each signal at the time of erasing data of the non-selected blocks erroneously at the time of the conventional block erase operation.
FIG. 7b is a timing chart of each signal of the non-selected blocks at the time of the block erase operation according to one embodiment of the present invention.
FIG. 7c is a timing chart of each signal of the non-selected blocks at the block erase operation according to another embodiment of the present invention.

FIG. 7(a) is a timing chart showing a flow of the block erase operation, the diagram showing waveforms of each signal in the case of an error erase occurring in the non-selected blocks at the time of the conventional block erase operation.

Firstly in the timing T1, the control gate line is discharged to ground potential. To discharge the word line of selected block to the ground potential, Vdd is supplied to the gate of transfer transistor TrG (selection) of the selected block, thus the transfer transistor of the selected block becomes an on-state. At the same time, the gate of transfer transistor TrG (non-selection) is set to be ground potential so that the word lines of non-selected blocks become a floating state, thus the transfer transistor of the selected block is controlled to an off-state.

Subsequently, at the timing T2, an erase voltage (of about 20 V) is supplied to the p-type well of the plane.

Afterwards, between the timing T2 and the timing T4, in the selected block, electrons of the floating gate of the memory cell are discharged to the p-type well region, so that data per block unit is erased. On the other hand, in the non-selected blocks, data is not erased.

Then at the timing T4, discharge of the ease voltage (of about 20 V) which is supplied to the p-type well, is launched.

To reduce the erase operation time, when rapidly changing the discharge gradient from the timing T4, at the timings T4 to T5, because of the coupling capacitive of the control gate line and the p-type well, the potential of the control gate line is lowered to electronegative potential, affecting a rapid voltage change accompanying the discharge. In the non-selected blocks, the voltage of the control gate line is lowered to electronegative potential, and if the potential difference between the potential of the control gate line and the potential of the gate of transfer transistor TrG (non-selection) of the non-selected blocks is beyond the threshold Vth of the gate TrG (non-selection) of transfer transistor of non-selected blocks, a bipolar action occurs between the control gate line and the gate of transfer transistor TrG (non-selection). Thus, the transfer transistor that should be in an off-state becomes an on-state. As a consequence, the word lines (non-selection) of the non-selected blocks and the control gate CG are conducted, and the potential of word lines WL (non-selected) of the non-selected blocks decreases to equal to or lower than the ground potential. At this time, when the difference between the potential of p-type well and that of word lines (non-selection) is large in the way of discharge of the erase voltage of p-type well, data will be erased, with the electrons being pulled off to the p-type well from the floating gate; in other words, an error erase will occur.

Figure 8:
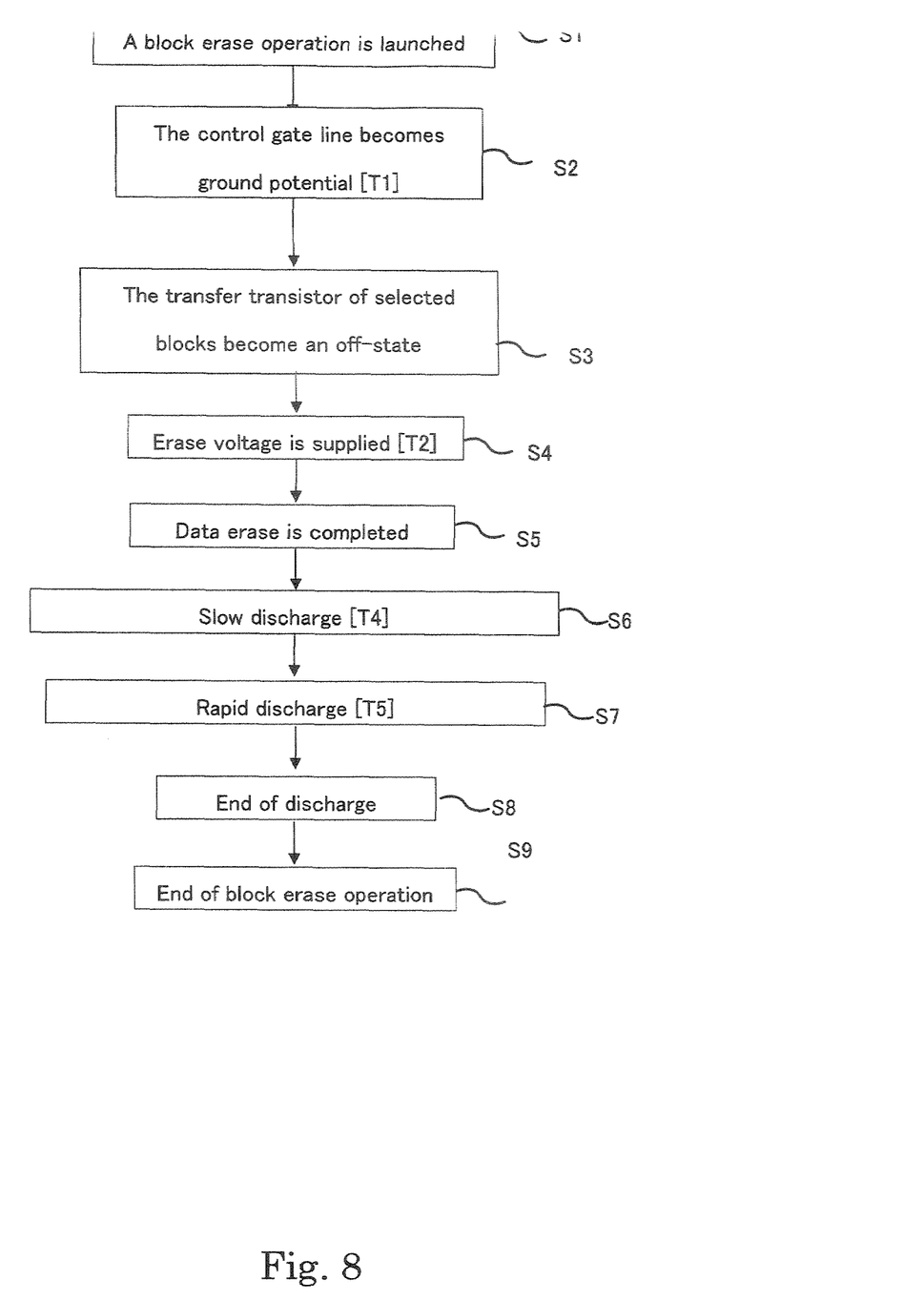
FIG. 8 is a diagram showing state transition at the block erase operation of the non-selected blocks according to one embodiment of the present invention.

FIG. 7(b) is a timing chart which shows a flow of the erase operation according to one embodiment of the present invention, a diagram showing waveforms of each signal at the time of providing a period for moderating the discharge of erase voltage of the p-type well, to present the error erase shown in FIG. 7(a). FIG. 8 is a diagram according to one embodiment of the present invention showing a state transition at the time of block erase operation of FIG. 7(b).

At first, explanation will be performed using FIG. 8. In the step S1 of FIG. 8, when an erase operation is launched, the control gate line becomes ground potential in the step S2 (timing T1). In the step S3, the transfer transistor of selected blocks become an off-state, thus the word lines (selection) becomes ground potential. The transfer transistor of non-selected blocks is in an off-state, and the word lines WL (non-selection) becomes a floating state. In the step S4 (timing T2), an erase voltage (of about 20 V) is supplied to the p-type well. In the step S5 (timing T4), electrons are pulled off to the p-type well from the floating gate of the memory cell of the selected blocks and thus the data erase is completed. In the step S6 (timing T4), discharge of an erase voltage (of about 20 V) which is supplied to the p-type well is launched, and the discharge gradient. At this time the discharge is launched moderately (slow discharge). In the step S7 (timing T5), the discharge gradient is strengthened to make the discharge gradient acute (rapid discharge). In the step S8 (timing T6), when the discharge of the erase voltage, which is supplied to the p-type well, is completed, the series of block erase operations described above is completed in the step S9.

Figure 9:
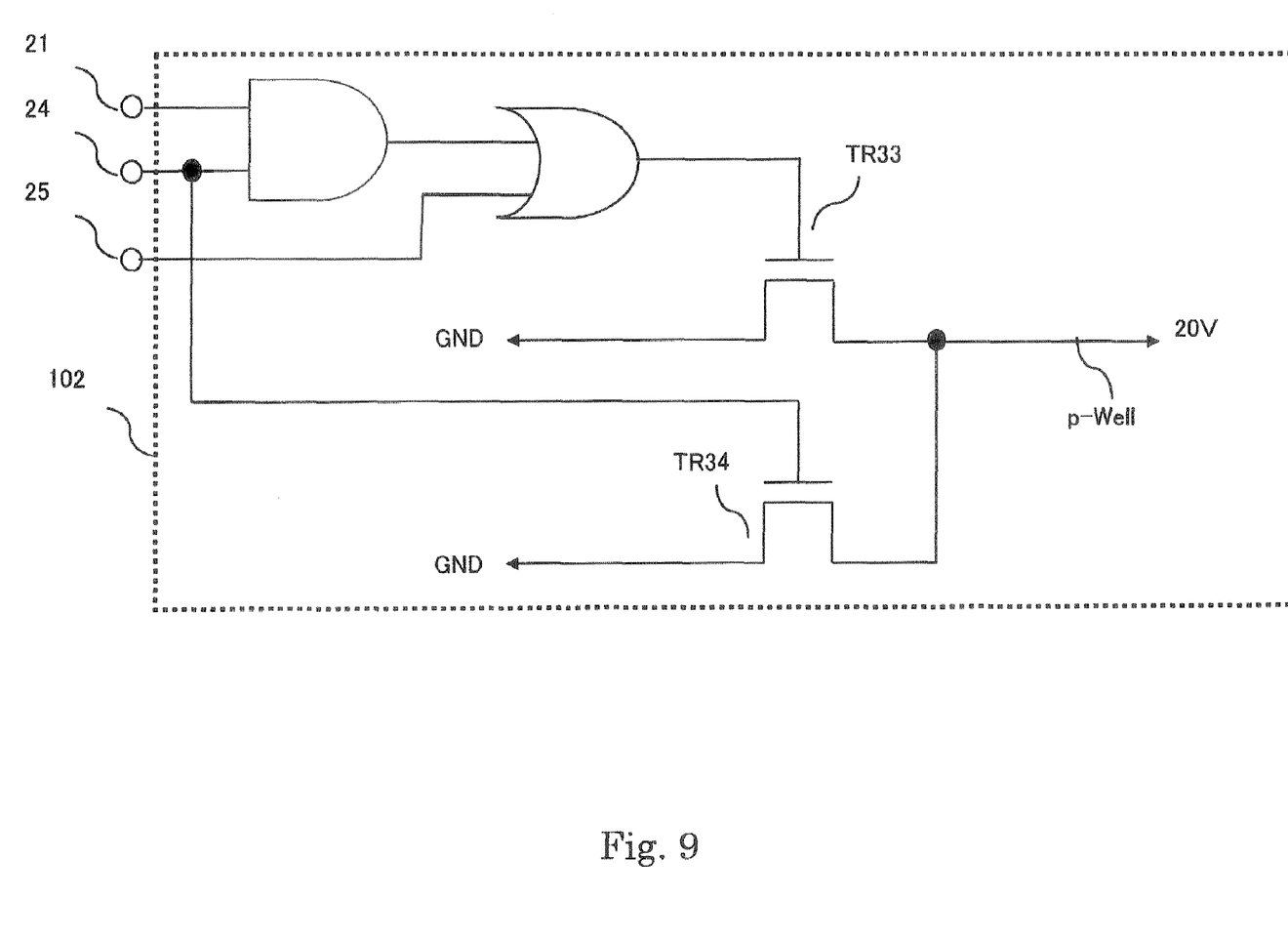
FIG. 9 is a circuit diagram of a discharge circuit of the erase voltage according to one embodiment of the present invention.
Figure 10:
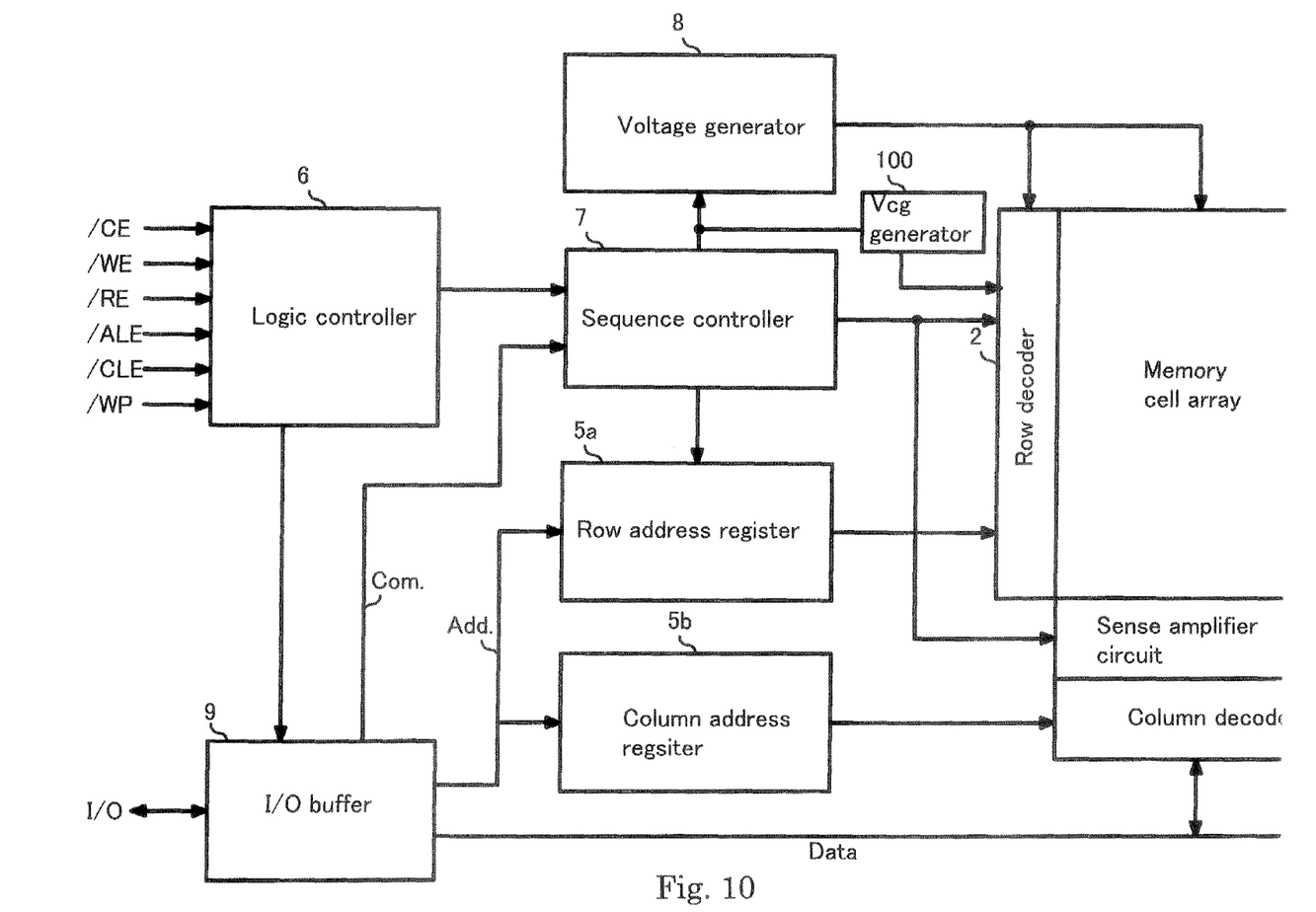
FIG. 10 is a block diagram showing a configuration of the NAND type flash memory device in which a Vcg circuit according to one embodiment of the present invention is provided separately.

FIG. 9 is a diagram showing an example of a discharge circuit provided to discharge the erase voltage (of about 20 V) supplied to the p-type well. In the step S6 (timing T4), the discharge of the erase voltage (of about 20 V) which is supplied to the p-type well, is launched. Then, in the step S7 (timing T5), operations to strengthen the discharge and to rapidly change the discharge gradient is realized by the discharge circuit 102 shown in FIG. 9. The discharge 102 shown in FIG. 9 may be provided inside of the voltage generation circuit shown in FIG. 1. In addition, as shown in FIG. 10, a Vcg generation circuit 100 may be provided separately with the voltage generation circuit 8. The control signal is supplied to the node 21, the node 24, and the node 25 which are shown in FIG. 9, from the sequence controller shown in FIG. 1.

The switching transistor, which has a small time constant, is used for the switching transistor Tr33 of the discharge circuit 102 (a second switch element). On the other hand, the switching transistor, which has a larger time constant compared to the switching transistor Tr33, is used for the switching transistor Tr34 (the first switch element). At first, if the selection signal, which is input to the node 24 of FIG. 9, becomes a high level, the switching transistor Tr34, which has a large time constant, becomes an on-state, and the discharge gradient of the erase voltage which is supplied to the p-type well becomes moderate, thus the discharge period becomes long. Although not shown in the figures, a time constant circuit of resistance and capacitor may be inserted between the source of switching transistor Tr34 and the ground (GND).

Next, if the selection signal, which is input to the node 25, becomes high level, the switching transistor Tr33, which has a small time constant, becomes an on-state, the discharge gradient of the erase voltage of the p-type well becomes acute, the discharge period becomes short, the discharge is completed, and thus the block erase operation is completed. That is, when the transistor Tr34 is set to be an on-state and is set to be a first discharge period, and when the transistor Tr33 is set to be an on-state and is set to be a second discharge period.

Next, explanation will be performed using FIG. 7(b). Because the waveforms of each signal from the timing T1 to the timing T4 are the same as those of FIG. 7(a), explanation will be omitted.

When the data erase of selected block is completed until the timing T4, in the timing T4, the discharge of the erase voltage which is supplied to the p-type well is moderately launched. That is, the discharge gradient is moderately changed. This is the beginning of the first discharge period.

Afterwards in the timing T5, the discharge of the erase voltage which is supplied to the p-type well is performed more rapidly than the discharge of the timing T4, that is, the discharge gradient is rapidly changed. This is the beginning of the second discharge period.

Thus, the discharge operation of the erase voltage (of about 20 V) which is supplied to the p-type well is divided into 2 stages of first and second discharge periods, the first of which is set to be a weak discharge period which becomes a moderate discharge gradient and the second of which is set to be a strong discharge period which becomes an acute discharge gradient after a constant time has elapsed. As a consequence, the first discharge period becomes longer as compared to the second discharge period. In the discharge operation, the voltage of word line WL (selected) of the selected block is lowered to the electronegative potential by coupling capacitive between the p-type well and the word line of the selected block, and the control gate line is lowered into the electronegative potential. However, the electronegative potential level is held at a high level not lower than the case shown in FIG. 7(a). That is, the potential difference between the potential of the control gate and the potential of the gate of transfer transistor TrG (non-selection) of the non-selected blocks does not reach the threshold Vth of the gate of transfer transistor TrG (non-selection) of the non-selected blocks; thus, bipolar action will not occur. Therefore, the word line WL (non-selected) of the non-selected blocks keeps a floating state, thus the error erase of data in the non-selected blocks may be prevented.

However, as the discharge time of the erase voltage of the p-type well becomes longer, the time of erase operation becomes longer compared to the operation of FIG. 7(a).

FIG. 7(c) is a diagram showing waveforms of each signal of the non-selected blocks in the erase method according to one embodiment of the present invention, a diagram showing waveforms of each signal in a method for preventing the error erase shown in FIG. 7(a) and to avoid a lengthening of the discharge time of the erase voltage of the p-type well shown in FIG. 7(b).

Because the waveforms of each signal from the timing T1 to the timing T2 of FIG. 7(c) is the same as those of FIG. 7(a) and (b), explanation will be omitted.

Subsequently, in the timing T3 before the beginning of discharge voltage of the p-type well, the electropositive potential (herein after called "Vcg") is supplied to the entire control gate line (CG), then the discharge period is launched. A method for charging the control gate line to Vcg is controlled, in the timing T3 by the sequence controller 7 and the voltage generation circuit 8, to apply, for instance, voltage used at the time of program verification (for instance, about 1.0 V) or readout voltage used at the time of data readout (for instance, about 4V), to the control gate line. Either of the voltages used at the time of program verification and the readout voltage is generated in the voltage generation circuit shown in FIG. 1. In addition, the Vcg generation circuit 100, which generates Vcg, may be provided outside, separately from the voltage generation circuit 8, as shown in FIG. 10. In this case, in the timing T3, the voltage Vcg, which is generated with the Vcc generation circuit 100 provided outside, is supplied to the control gate line.

When the potential of control gate lines(CG) increases, the potential of the word line of the selected block also increases. However in the timing T3, data erase is already completed in the selected block; therefore, there will be no influence on the selected block. In addition, the gate potential of transfer transistor TrG (non-selection), which exists between the word line WL (non-selection) of the non-selected blocks and the control gate, is ground potential. Therefore, the potential of the word line WL (non-selected) of the non-selected block will not be changed.

Next, when the potential of the control gate line increases to Vcg, in the timing T4, the discharge of erase voltage of the p-type well, as the potential of the control gate line is kept to Vcg. Even if the discharge is launched, bipolar action does not occur as long as the potential of control gate line is Vcg, which does not fall to electronegative potential. Thus, the data of non-selected blocks will not be erased. Therefore, discharge potential may be strengthened and is different to the method shown in FIG. 7(b) and FIG. 8, and as a consequence, the discharge time can be reduced Last, when the discharge of erase voltage of the p-type well is completed, in the timing T6, the control gate line (CG) is discharged to ground potential, and thus the charge period is completed.

As far as performing the above-described operation, in the non-selected blocks, data destruction will not occur, and the erasing time will bereduced by further strengthening the discharge ability of the substrate.

Figure 11:
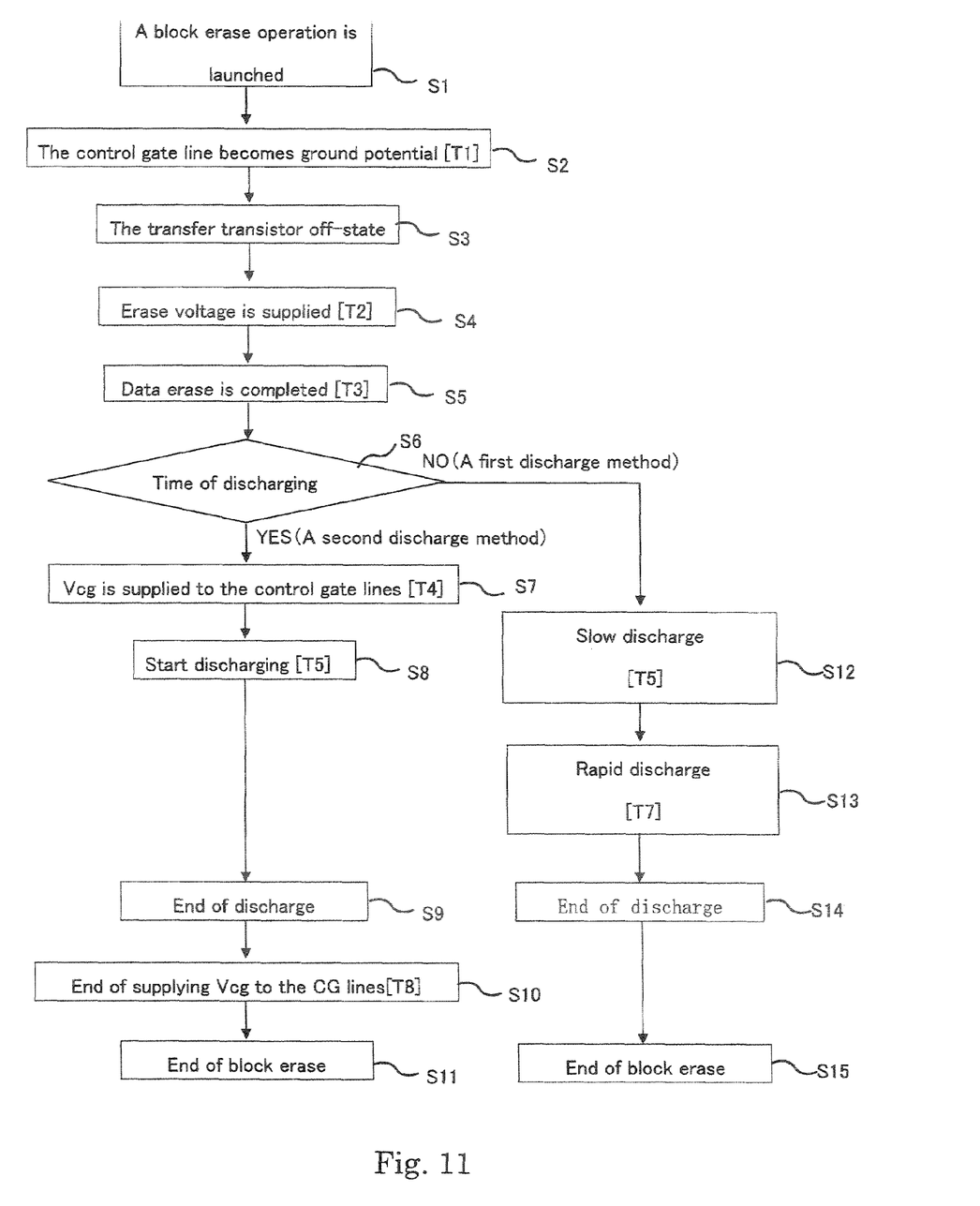
FIG. 11 is a diagram showing a state transition at the time of the block erase operation of the non-selected blocks according to one embodiment of the present invention.

FIG. 11 is a diagram according to one embodiment of the present invention showing a state transition of the embodiment, in which the 2 methods, for preventing error erase of data of the non-selected blocks shown in FIG. 7(b) (hereinafter called "a first discharge method") and preventing the error erase of data of the non-selected blocks shown in FIG. 7(c) (hereinafter called "a second discharge method"), can be selected as options.

The erase operation of the first discharge method is longer that that of the second discharge method. However, in the second discharge method, power consumption increases at the time of charging the control gate line to Vcg as compared to the first discharge method. The embodiment shown in FIG. 11, provides two options which allow selection of either method 1 i.e. preventing the error erase operation of data of the non-selected blocks and to give priority to reducing operation time or method 2 i.e. to give priority to reducing power consumption.

The transition of the steps S1 to S5 in FIG. 11 is the same as FIG. 8 and thus explanation will be omitted. In FIG. 11, either one of the first discharge methods shown in FIG. 7(b) and the second discharge method shown in FIG. 7(c), is selected in the step S6.

If the second discharge method is selected, the control gate line (CG) is discharged to Vcg in the step S7. In the step S8, the erase voltage is discharged. If the second discharge is selected, it is a strong (rapid) discharge, and the discharge becomes shorter than the first discharge method. In the step S9, if the discharge of the erase voltage of the p-type well is completed, Vcg of the control gate is returned to ground potential in the step S10, then the block erase operation is completed in the step S11.

Each operation of step S12 to S15 in the case of selecting the first discharge method shown in FIG. 11 is the same as the steps S6 to S9 shown in FIG. 8 and thus explanation will be omitted.

Figure 12:
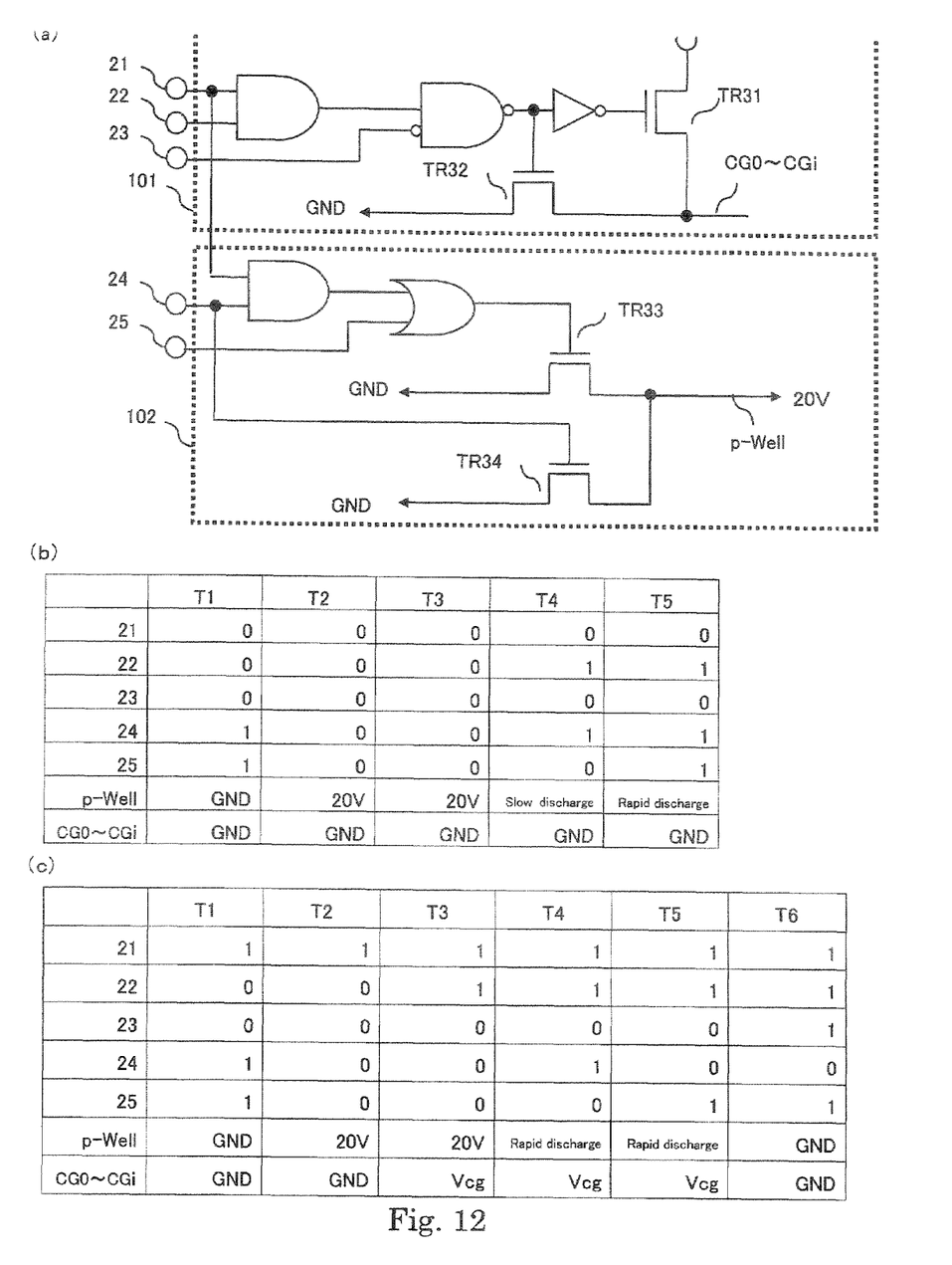
FIG. 12a is a circuit diagram according to one embodiment of the present invention.
FIG. 12b is a table showing logic and a voltage according to the first discharge method.
FIG. 12c is logic and voltage according a second discharge method.

FIG. 12(a) is a circuit diagram showing a discharge selection section which enables selection of either of the first or second discharge methods as a method for performing the state transition diagram of FIG. 11. The selection circuit of the first and the second discharge method shown in FIG. 12(a) is configured to the Vcg transfer circuit 101 and the discharge circuit 102.

Tr31 is a switching transistor, in which the gate voltage selects whether the control gate line should be connected to Vcg or not. Tr32 is a switching transistor, in which the gate voltage selects whether the control gate line should be connected to ground potential or not. Tr33 is a switching transistor which has a small time constant, and in which the gate voltage selects whether the p-type well should be connected to ground potential or not. Tr34 is a switching transistor which has a large time constant as compared to Tr33, and in which the gate voltage selects whether the p-type well should be connected to ground potential or not.

Control signals from the sequence controller 7 shown in FIG. 1 or FIG. 10 are input into the node 21 to the node 25. Selection signals, in which the first discharge method and the second discharge method are selected, are input to the node 21. Selection signals, which select whether the control gate line should be connected to the Vcg voltage or not, are input to the node 22. Selection signals, which select whether the control gate line should be connected to ground potential or not, are input to the node 23. Selection signals, which select whether the discharge of the erase voltage of the p-type well should be launched or not, are input to the node 24. Selection signals, which select whether the discharge ability should be strengthened or not, are input to the node 25.

FIG. 12(b) is a table showing logic of the nodes 21 to 25 of FIG. 12(a) at the time of selecting the first discharge method, potentials of the p-type well and potentials of the control gate line.

Before the beginning of the erase operation, the node 21 becomes "0," and the first discharge method is selected. In the timing T1, the node 22 is set to be "0" and the node 23 is set to be "0", the switching transistor TR32 is set to be an on-state, and the control gate lines CG0 to CGi−1 are set to be ground potentials. As this occurs, although not shown in FIG. 12(b), the transfer transistor of the non-selected blocks is set to be an off-state, and the potential of the gate of transfer transistor TrG is set to be ground potential so that the word line should become a floating state.

In the timing T2, the node 24 and the node 25 are set to "0" from "1", TR33 and TR34 becomes an off-state, and the erase voltage (of about 20 V) is supplied to the p-type well.

The states of nodes 21 to 25 until the timing T4 are set to be unchanged, and the data of the selected block are erased in the state where the erase voltage is kept supplied to the p-type well.

In the timing T4, the node 22 is changed to "1" from "0", because the node 21 is "0", the control gate line is kept to hold ground potential. In addition, by making the switching transistor TR34, which has a large time constant, set to be in an on-state, keeping the node 24 "1" from "0" and the node 25 "0", moderate discharge is launched.

In the timing T5, the node 25 is set to "1" from "0", and the switching transistor TR33, which has a small time constant, becomes an on-state, and the erase voltage of the p-type well is discharged. Thereby the discharge is completed, and thus the blcok erase operation is completed.

FIG. 12(c) is a table showing logic of the nodes 21 to 25 of FIG. 12(a) at the time of selecting the second discharge method, potentials of the p-type well and the potentials of the control gate line.

Before the beginning of the erase operation, the node 21 becomes "1" and the second discharge method is selected. In the timing T1 as well as FIG. 12(b), the node 22 is set to be "0" and the node 23 is set to be "0", the switching transistor TR32 is set to be an on-state, and the control gate lines CG0 to CGi−1 become ground potentials. In addition, in the timing T2, the node 24 and the node 25 are set to be "0" from "1", the switching transistor TR33 become an off-state, and the erase voltage (of about 20 V) is supplied to the p-type well. In addition, states of the nodes 21 to 25 is set to be unchanged, and thus data of the selected block is erased keeping the state of the erase voltage supplied to the p-type well.

Next, in the timing T3, when the node 22 becomes "1" from "0", the node 23 holds "0". Therefore, by becoming the switching transistor TR31 in an on-state and the switching transistor TR32 in an off-state, the control gate lines CG0 to CGi−1 are discharged to Vcgs.

Subsequently, in the timing T4, the node 24 is set to "1" from "0" and the erase voltage is discharged. If the node 24 becomes "1", not only the switching transistor TR34 but also the switching transistor TR33 become an on-state, because the node 21 is "1"; thus, the discharge ability of the erase voltage which is supplied to the p-type well becomes strong. Also, in the timing T5, the node 25 changes to "1" from "0". However, the state of switching transistor TR33 does not change because the switching transistor Tr33 is in an on-state.

After completing the discharge of the erase voltage of the p-type well, in the timing T6, the node 23 is set to "1" from "0", the switching transistor 32 becomes an on-state, and the control gate lines are returned to ground potentials, and thus the block erase operation is completed.

By the above-described embodiment, in the NAND type flash memory, in which many blocks can be erased at the same time, a data destruction of non-selected blocks may be prevented without increasing the erase operation time, by charging the electropositive potential to the control gate line before the beginning of the discharge of the erase voltage which is supplied to the p-type well. In addition, in the case where any erase operation time is impossible and priority should be given to inhibiting the power consumption, it becomes possible to launch the discharge of the erase voltage which is supplied to the p-type well and the discharge time is increased while the control gate line is kept at ground potential.

What is claimed is:

1. A non-volatile semiconductor memory device comprising:
    a plurality of memory cells being electrically programmable and electrically erasable, said memory cell having a channel region of p-type well formed on a n-type semiconductor substrate;
    a plurality of memory blocks having said plurality of memory cells;
    a selection circuit selecting said block;
    a plurality of word lines arranged in said block and commonly connected to said memory cells arranged in the same row of said block;
    a plurality of control gate lines arranged corresponding to each of said word lines and supplying voltages to said corresponding word line;
    a plurality of transfer transistors selectively connecting said plurality of word lines and said plurality of control gate lines respectively;
    a controller setting time of charging said control gate lines after an erase operation in more than one said block at the same time; and
    a voltage generator charging said control gate line within said time of charging set by said controller.

2. The non-volatile semiconductor memory device according to claim 1, wherein said controller starts charging said control gate line before discharging an erase voltage supplied to said p-type well after said erase operation.

3. The non-volatile semiconductor memory device according to claim 1, wherein said voltage generator comprises a circuit which changes the voltages charging said control gate lines.

4. The non-volatile semiconductor memory device according to claim 1, wherein said voltage generator generates a voltage supplied to said p-type well and a voltage supplied to said control gate line.

5. The non-volatile semiconductor memory device according to claim 1, wherein said voltage generator generates a voltage supplied to said control gate line.

6. The non-volatile semiconductor memory device according to claim 1, wherein each of the plurality of memory cells is a NAND type EEPROM cell.

7. A non-volatile semiconductor memory device comprising:
- a plurality of memory cells being electrically programmable and electrically erasable, said memory cell having a channel region of p-type well formed on a n-type semiconductor substrate;
- a plurality of memory blocks having said plurality of memory cells;
- a selection circuit selecting said block;
- a plurality of word lines arranged in said block and commonly connected to said memory cells arranged in the same row of said block;
- a plurality of control gate lines arranged corresponding to each of said word lines and supplying voltages to said corresponding word line;
- a plurality of transfer transistors selectively connecting said plurality of word lines and said plurality of control gate lines respectively;
- a controller setting time of charging said control gate lines after an erase operation in more than one said block at the same time;
- a voltage generator charging said control gate line within said time of charging set by said controller; and
- a discharge selection section selecting either a first discharge method and a second discharge method, said first discharge method being starting charging said control gate line before discharging an erase voltage supplied to said p-type well after said erase operation and said second discharge method being changing said time of discharging said erase voltage.

8. The non-volatile semiconductor memory device according to claim 7, wherein said controller starts charging said control gate line before discharging an erase voltage supplied to said p-type well after said erase operation.

9. The non-volatile semiconductor memory device according to claim 7, wherein said voltage generator comprises a circuit which changes voltages charging said control gate lines.

10. The non-volatile semiconductor memory device according to claim 7, wherein said voltage generator generates a voltage supplied to said p-type well and a voltage supplied to said control gate line.

11. The non-volatile semiconductor memory device according to claim 7, wherein said voltage generator generates a voltage supplied to said control gate line.

12. The non-volatile semiconductor memory device according to claim 7, further comprising a discharge circuit changing said time of discharging the erase voltage in said discharging method.

13. The non-volatile semiconductor memory device according to claim 12, wherein said discharge circuit discharges said erase voltage in a first discharge period and a second discharge period.

14. The non-volatile semiconductor memory device according to claim 13, wherein said discharge circuit discharges said erase voltage firstly in said first discharge period and then subsequently discharges said erase voltage in said second discharge period.

15. The non-volatile semiconductor memory device according to claim 13, wherein said first discharge period is longer than said second discharge period.

16. The non-volatile semiconductor memory device according to claim 13, wherein said discharge circuit comprises a first switching device setting said first discharge period and a second switching device setting said second discharge period.

17. The non-volatile semiconductor memory device according to claim 16, wherein the first switching device has time constants different from the second switching device.

18. The non-volatile semiconductor memory device according to claim 17, wherein said first switching device and said second switching device are a first transistor and a second transistor respectively, and a time constant of said first transistor is longer than that of said second transistor.

19. The non-volatile semiconductor memory device according to claim 16, wherein said controller connects said first switching device to said p-type well in said first discharge period and said controller connects said second switching device connected to said p-type well in said second discharge period.

20. The non-volatile semiconductor memory device according to claim 7, wherein each of the plurality of memory cells is a NAND type EEPROM cell.

* * * * *